(12) United States Patent
Wachman et al.

(10) Patent No.: US 11,947,880 B2
(45) Date of Patent: *Apr. 2, 2024

(54) SYSTEMS AND METHOD FOR DETERMINING SOLAR PANEL PLACEMENT AND ENERGY OUTPUT

(71) Applicant: SUNPOWER CORPORATION, San Jose, CA (US)

(72) Inventors: Jake Wachman, San Jose, CA (US); Matt Moone, San Jose, CA (US); Anthony Garzolini, San Jose, CA (US); Jeff Southard, San Francisco, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 144 days.

This patent is subject to a terminal disclaimer.

(21) Appl. No.: 17/138,130

(22) Filed: Dec. 30, 2020

(65) Prior Publication Data

US 2021/0117587 A1 Apr. 22, 2021

Related U.S. Application Data

(63) Continuation of application No. 15/892,961, filed on Feb. 9, 2018, now Pat. No. 10,902,159.

(Continued)

(51) Int. Cl.
*H02S 99/00* (2014.01)
*G06F 3/04842* (2022.01)
(Continued)

(52) U.S. Cl.
CPC .............. *G06F 30/13* (2020.01); *G06F 30/00* (2020.01); *G07G 1/0018* (2013.01); *H02S 20/23* (2014.12); *H02S 99/00* (2013.01); *G06F 3/04842* (2013.01)

(58) Field of Classification Search
CPC .......... G06F 30/13; G06F 30/00; H02S 20/23; H02S 99/00; G07G 1/0018
(Continued)

(56) References Cited

U.S. PATENT DOCUMENTS 7,925,552 B2 * 4/2011 Tarbell ................. G06Q 30/04
705/30
8,682,585 B1 * 3/2014 Hoff ...................... G06Q 10/04
702/3

(Continued)

FOREIGN PATENT DOCUMENTS

DE 102018202401 A1 * 8/2018 ............. G06F 30/00

OTHER PUBLICATIONS

Aron P. Dobos (PVWatts Version 5 Manual, 2014) (Year: 2014).*

(Continued)

*Primary Examiner* — Iftekhar A Khan
(74) *Attorney, Agent, or Firm* — Oblon, McClelland, Maier & Neustadt, L.L.P.

(57) ABSTRACT

Determining solar panel placement enables sales representatives and homeowners to modify a solar power system by adding or removing solar panels or arrays of solar panels, or changing module type. The user sees the corresponding solar energy production update instantly in a user interface. Determining solar panel placement includes receiving data corresponding to an installation location. A maximum solar panel design is determined based on the installation location. Energy production is determined for a solar panel on each section of a roof of an installation location, and the energy production and energy offset are dynamically displayed in real time when any solar panel or array is selected or deselected.

20 Claims, 5 Drawing Sheets

Related U.S. Application Data (60) Provisional application No. 62/460,263, filed on Feb. 17, 2017.

(51) Int. Cl.
*G06F 30/00* (2020.01)
*G06F 30/13* (2020.01)
*G07G 1/00* (2006.01)
*H02S 20/23* (2014.01)

(58) Field of Classification Search
USPC .......................................................... 703/1
See application file for complete search history.

(56) References Cited

U.S. PATENT DOCUMENTS

| | | | |
|---|---|---|---|
| 8,825,500 B2* | 9/2014 | DeBartolo, III | F24S 25/00 126/621 |
| 9,160,408 B2* | 10/2015 | Krohne | H02J 13/00007 |
| 9,325,364 B2* | 4/2016 | Teichmann | H02S 20/32 |
| 9,880,230 B1* | 1/2018 | Hoff | G06Q 10/04 |
| 10,366,287 B1* | 7/2019 | Loveland | G06V 20/58 |
| 10,754,999 B1* | 8/2020 | Vratimos | F24S 90/00 |
| 10,769,318 B2* | 9/2020 | Wachman | G07G 1/0018 |
| 10,902,159 B2* | 1/2021 | Wachman | G06F 30/00 |
| 2007/0235071 A1* | 10/2007 | Work | H02J 7/35 136/244 |
| 2008/0283112 A1* | 11/2008 | Conger | F24S 25/50 136/244 |
| 2009/0234692 A1* | 9/2009 | Powell | G06Q 30/0611 707/999.005 |
| 2010/0089433 A1* | 4/2010 | Conger | H02S 20/10 136/244 |
| 2010/0198420 A1* | 8/2010 | Rettger | H02S 10/00 706/46 |
| 2011/0205245 A1* | 8/2011 | Kennedy | G06Q 50/06 345/636 |
| 2012/0031456 A1* | 2/2012 | Christman | H02S 20/10 136/244 |
| 2012/0031470 A1* | 2/2012 | Dimov | F24S 25/613 136/251 |
| 2012/0035887 A1* | 2/2012 | Augenbraun | G06T 15/50 703/1 |
| 2012/0167957 A1 | 7/2012 | Verfuerth | |
| 2012/0245745 A1* | 9/2012 | Vandevelde | H02S 50/00 700/286 |
| 2012/0310427 A1* | 12/2012 | Williams | H01L 31/02021 702/182 |
| 2012/0330759 A1* | 12/2012 | Aggarwal | G06Q 50/06 715/733 |
| 2013/0158954 A1* | 6/2013 | Wayne | G06F 30/00 703/1 |
| 2013/0246010 A1* | 9/2013 | Dershowitz | H02S 50/00 703/1 |
| 2014/0019086 A1 | 1/2014 | Gregg | |
| 2014/0025343 A1* | 1/2014 | Gregg | G06F 30/13 703/1 |
| 2014/0149081 A1 | 5/2014 | Hinners | |
| 2014/0188410 A1* | 7/2014 | Kerrigan | G01R 21/00 703/18 |
| 2014/0246072 A1* | 9/2014 | Wayne | H02S 50/10 136/244 |
| 2014/0289168 A1* | 9/2014 | Wayne | G06Q 30/0283 705/400 |
| 2014/0331198 A1* | 11/2014 | Bischoff | H02S 20/10 716/135 |
| 2014/0351108 A1* | 11/2014 | Smith | G06Q 30/04 705/34 |
| 2014/0366466 A1* | 12/2014 | DeBartolo, III | E04F 10/08 52/173.3 |
| 2015/0001201 A1* | 1/2015 | Adler | H01L 31/024 320/101 |
| 2015/0066442 A1* | 3/2015 | Pryor | G06Q 50/16 136/251 |
| 2015/0088682 A1* | 3/2015 | Wayne | G06Q 30/0621 705/26.5 |
| 2015/0155414 A1* | 6/2015 | Bedell | H01M 10/465 126/681 |
| 2015/0199104 A1* | 7/2015 | Gontowski | G06Q 30/08 715/771 |
| 2015/0269664 A1* | 9/2015 | Davidson | G06Q 40/00 705/35 |
| 2015/0326176 A1* | 11/2015 | Austin | H02S 40/34 136/246 |
| 2015/0331972 A1* | 11/2015 | McClure | G06F 17/11 703/2 |
| 2016/0004796 A1* | 1/2016 | Hinners | G06F 30/12 703/1 |
| 2016/0065116 A1* | 3/2016 | Conger | H02S 20/10 136/251 |
| 2016/0097565 A1* | 4/2016 | King | B25B 11/02 29/721 |
| 2016/0125557 A1* | 5/2016 | Rosner | H01L 31/02021 705/7.23 |
| 2016/0190812 A1 | 6/2016 | Myer | |
| 2016/0218514 A1* | 7/2016 | Takeda | H02J 3/381 |
| 2016/0218551 A1* | 7/2016 | Sano | H02S 40/38 |
| 2016/0232636 A1* | 8/2016 | Wayne | G06Q 50/26 |
| 2016/0238388 A1* | 8/2016 | MacDonald | H02S 99/00 |
| 2016/0292312 A1* | 10/2016 | Saha | G06Q 50/06 |
| 2017/0091578 A1* | 3/2017 | Ananthakrishnan | G06V 20/176 |
| 2017/0366133 A1* | 12/2017 | Taha | H02S 20/10 |
| 2018/0062572 A1* | 3/2018 | Kunesh | F24S 30/452 |
| 2018/0115275 A1* | 4/2018 | Flanigan | H02S 20/25 |
| 2018/0165382 A1 | 6/2018 | Williamson | |
| 2018/0239841 A1* | 8/2018 | Wachman | H02S 99/00 |
| 2018/0365352 A1 | 12/2018 | Bieganek | |
| 2020/0097620 A1 | 3/2020 | Wachman | |

OTHER PUBLICATIONS

Jazayeri et al. (Experimental Analysis of Effects of Installation Alignment and Solar Insolation on Power Generation by Solar Panels, IEEE, 2013, pp. 35-40) (Year: 2013).*

Ali et al. ("Design Optimization of Solar Power System with respect to Temperature and Sun Tracking", AIC-M ITCSA, 2016, pp. 1-5) (Year: 2016).

Jazayeri et al. ("Experimental Analysis of Effects of Installation Alignment and Solar Insolation on Power Generation by Solar Panels", IEEE, 2013, pp. 1-6) (Year: 2013).

Aron P. Dobos ("PVWatts Version 5 Manual", 2014, pp. 1-17) (Year: 2014).

Kasahara et al. ("Added Values of Photovoltaic Systems", 3rd World Confemnee on Photovolrnic Engergy Conersion May 11-18, 2003 Osaka, Japan, pp. 2419-2422) (Year: 2003).

Jazayeri et al. ("Experimental Analysis of Effects of Installation Alignment and Solar Insolation on Power Generation by Solar Panels", IEEE, 2013, pp. 35-41) (Year: 2013).

\* cited by examiner

SYSTEMS AND METHOD FOR DETERMINING SOLAR PANEL PLACEMENT AND ENERGY OUTPUT

CROSS-REFERENCE TO RELATED APPLICATION

This application is a continuation application which claims the benefit of priority under 35 U.S.C. § 120 of U.S. patent application Ser. No. 15/892,961, filed on Feb. 9, 2018, which claims the benefit of U.S. Provisional Application No. 62/460,263, filed Feb. 17, 2017, which are herein incorporated by reference in their entirety.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Modeling solar energy production data is a complex task with numerous variables and inputs. To calculate energy production for a given system, specific latitude/longitude, tilt azimuth, shading, insolation, and soiling, among other inputs, unique to that system and home must be understood. Existing solar design software requires nontrivial wait times to view energy production information after updating characteristics of the solar module or system, including tilt, azimuth, module count, and product type.

With existing methods for creating proposal-stage designs, determining the energy output of a design change is time-consuming. With these existing methods, every change to system or module size, tilt, azimuth, or product type requires re-calculating energy production data, which is typically performed at a remote server. This means that each iteration requires a request from a user device to a server for re-calculation, goal-seeking for either energy or monetary savings, and a reply from the server to the user device. As can be appreciated, this process can be very time-consuming, taking minutes or hours to complete.

Simplistic solar design software can provide quick iteration based on generic factors—for example, by providing a slider that uses a generic solar output curve for a given region. This option may allow the user device to be self-contained and eliminate communication between the user device and a remote server that performs the intensive calculations, but this method does not consider home-specific characteristics, including potential solar module locations, azimuth, tilt, and other critical design inputs. Thus, this method often yields imprecise or inaccurate estimates that lead to incorrect energy and savings expectations for homeowners.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to aspects of the disclosed subject matter, an electronic device (e.g., computer, laptop, smartphone, tablet, etc.) can generate and dynamically update energy yield estimates of a solar installation quickly and accurately based on real time design changes. For example, the electronic device can enable clients to modify solar power system designs by adding or removing solar panels or arrays of solar panels, or changing the solar panel type. The user can see the corresponding solar energy production update instantly in a user interface of a device being used to determine the solar panel placement without the need for the device to interact with a remote server during this process. Determining solar panel placement on such a self-contained device can include receiving data corresponding to an installation location (e.g., weather, latitude/longitude, etc.). Additionally, a maximum solar panel design can be determined based on the installation location, and a calculation for each section of a solar installation for each type of solar panel can be performed. As a result, the electronic device has all the information required to generate and update energy yield estimates of a solar installation stored locally on the electronic device. Then, without communicating with a remote server, energy production can be determined for a solar panel on each section of a roof of an installation location, and the energy production and energy offset can be dynamically displayed in real time when any solar panel or array is selected or deselected.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Figure 1:
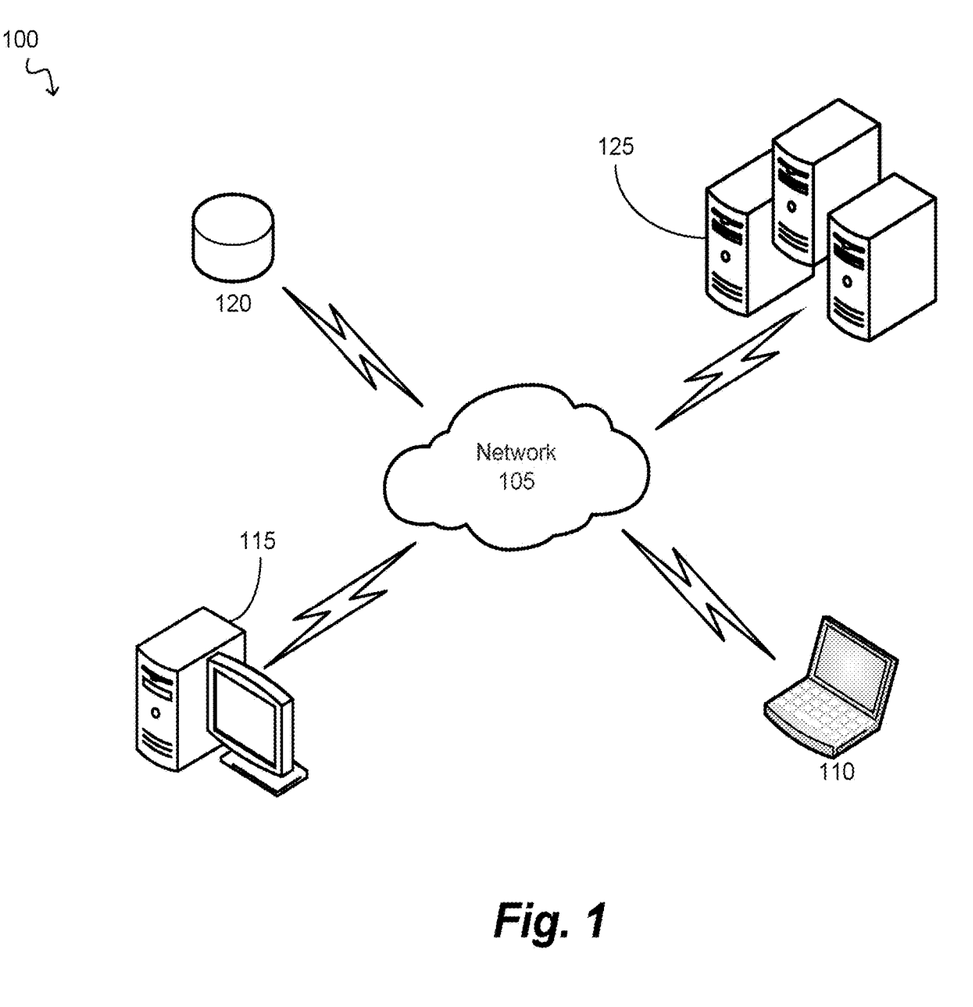
FIG. 1 depicts an exemplary overview of the solar panel placement optimization system according to one or more aspects of the exemplary disclosures provided herein.

Referring now to the drawings, wherein like reference numerals designate identical or corresponding parts throughout the several views, FIG. 1 depicts a solar panel placement optimization system 100 (herein referred to as system 100) according to one or more aspects of the exemplary disclosures. The system 100 can include a mobile device 110 connected to a computer 115, a database 120, and a server 125 via a network 105. The server 125 can represent one or more servers connected to the computer 115, the database 120, and the mobile device 110 via the network 105. The server 125 can include processing circuitry to perform various processing for the system 100 as further described herein. For example, the server 125 can receive requests from one or more of the mobile device 110, the computer 115, and the database 120 via the network 105. Additionally, the server 125 can transmit information to the mobile device 110, the computer 115, and the database 120 via the network 105. The database 120 can represent one or more databases connected to the computer 115, the server 125, and the mobile device 110 via the network 105. The mobile device 110 can represent one or more mobile devices connected to the computer 115, the server 125, and the database 120 via the network 105. The network 105 can represent one or more networks connecting the computer 115, the server 125, the database 120, and the mobile device 110.

The network 105 can be a public network, such as the Internet, or a private network such as an LAN or WAN network, or any combination thereof and can also include PSTN or ISDN sub-networks. The network 105 can also be wired, such as an Ethernet network, or can be wireless such as a cellular network including EDGE, 3G 4G, and LTE/LTE-A wireless cellular systems. The wireless network can also be Wi-Fi, Bluetooth, or any other wireless form of communication that is known.

The computer 115 and the mobile device 110 can include an interface, such as a digital and/or physical keyboard and/or a mouse and/or touch-based input functionality, allowing a user to select and deselect various options in the interface, for example. The selection and deselection of options in the interface can include selection and deselection of solar panels that have been displayed in one or more arrays, each array corresponding to a section of a roof, for example. The solar panels can be selected and deselected individually. Additionally, arrays can be selected and deselected which can select/deselect each solar panel in the array simultaneously. The computer 115 and/or the mobile device 110 can include processing circuitry to assist in operating the system 100, as further described herein. The mobile device 110 can also be any computing device including a computer, a smartphone, a laptop, a tablet, a PDA, and the like.

The database 120 can be a local storage component associated with the server 125 and/or the mobile device 110 or the database 120 can be an independent database accessible via the network 105. The database 120 can store various pieces of information including average solar panel energy production for each panel type for each array. Additionally, the database 120 can store various pieces of information corresponding to the installation location including weather, latitude/longitude, tilt, azimuth, shading, insolation, soiling, local fire codes, and the like that are unique to the installation location. More specifically, this information can be determined for each section of the roof of the installation location, as further described herein. As can be appreciated, information such as the average solar panel energy can be stored in the database 120 as a one or more look-up tables in which one axis may represent the type of solar panel, and the other axis may represent an average energy production for each roof on which the solar panel may be installed. Other arrangements of this information are also possible without departing from the scope of the advancements described herein.

The server 125 can receive signals from one or more of the mobile device 110, the computer 115, and/or the database 120 to assist in operating the system 100. Additionally, the server 125 can transmit signals to one or more of the mobile device 110, the computer 115, and/or the database 120 to assist in operating the system 100.

Figure 2:
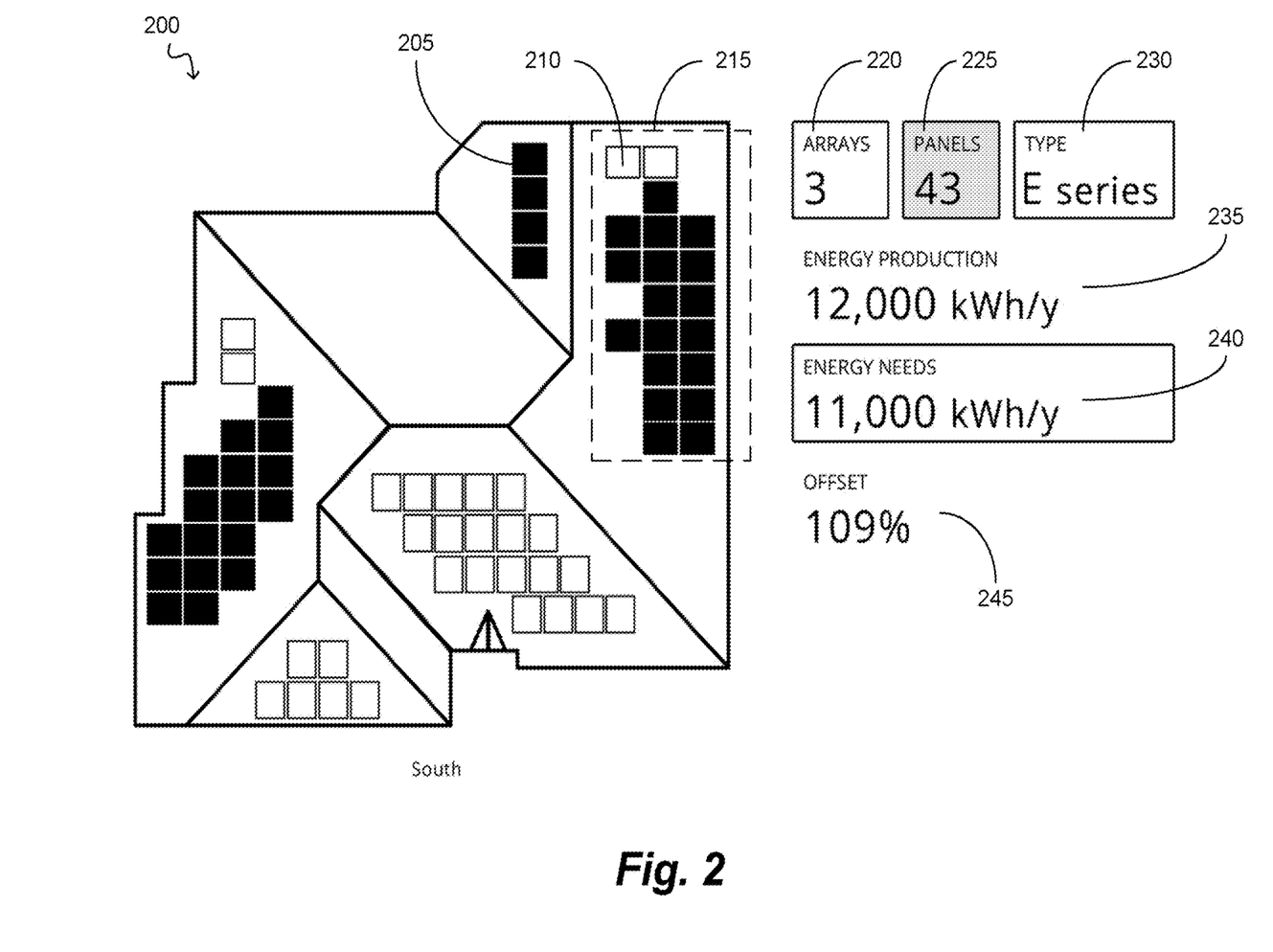
FIG. 2 depicts a user interface for optimizing solar panel placement according to one or more aspects of the exemplary disclosures.

FIG. 2 depicts a user interface 200 for optimizing solar panel placement according to one or more aspects of the exemplary disclosures. The user interface 200 can include a selected solar panel 205, a deselected solar panel 210, an array of solar panels 215, an array number indicator 220, a solar panel number indicator 225, a solar panel type 230, energy production 235, energy needs 240, and an energy production offset 245.

Individual solar panels 205, 210 can be deselected/selected, respectively. The solar panel number indicator 225 can indicate the number of solar panels currently selected. Additionally, when the solar panel number indicator 225 is highlighted, the user interface 200 can be configured to receive input corresponding to the selection and/or deselection of individual solar panels 205, 210 rather than selecting and/or deselecting an entire array of solar panels. For example, if any deselected solar panel 210 is selected, the solar panel number indicator can increase by one and can continue to increase with each newly selected solar panel. Similarly, if a currently selected solar panel 205 is deselected, the solar panel number indicator 225 can decrease by one for each deselected solar panel. With reference to FIG. 2, forty-three solar panels are selected out of a possible 72 solar panels. The maximum number of solar panels that can be installed at an installation location can be based on a MaxFit design. The MaxFit design can be based on the number of solar panels that can be placed on each section of a roof at an installation location. More specifically, a maximum solar panel design can correspond to a predetermined layout of a maximum number of panels that can be placed on a roof given certain constraints such as building codes, shade considerations, weather, latitude/longitude, tilt, azimuth, insolation, soiling, and the like. An example of the maximum solar panel design can be a MaxFit design. Accordingly, the MaxFit design, and therefore the placement of each solar panel, can be based on weather, latitude/longitude, tilt, azimuth, shading, insolation, soiling, local fire codes, and the like that are unique to the installation location. The MaxFit design can be determined before a salesperson goes on a sales call, for example. The information that is input to determine the MaxFit design can be pulled from public records, satellite imagery, third-party data services, user-inputted values that characterize the home and its environment, and the like.

An energy production estimate for a solar panel in each array can be determined via a request to the server 125, for example, as part of a pre-calculation prior to disconnecting the computer 115 or mobile device 110 from the server 125 and/or the database 120. The pre-calculations can generate a data set of average energy production for each solar panel type placed in a specific array. The data set can be stored locally on the mobile device 110, for example, such that the mobile device 110 can calculate energy production for each combination of solar panel and solar panel type available in the design without any communication with the sever 125. As noted above, this information may be stored on the mobile device 110 (or computer 115) as one or more look-up tables. More specifically, an energy production estimate for a single solar panel of each available panel type for each array can be determined via a request to the server 125 during the pre-calculation so that this information can be determined and stored in the mobile device 110 or computer 115 before the mobile device 110 or computer 115 is taken to, for example, a job site.

Once the pre-calculation phase is complete, the mobile device 110 or the computer 115 may be taken to a job site where the interface illustrated in FIG. 2 may be used to determine solar panel placement and resulting energy output. Thus, by calculating and storing the average energy output for each solar panel type, the present advancements specifically improve the functionality of the mobile device 110 (or computer 115) in that these devices can now accurately determine solar panel placement and corresponding energy output without the time-consuming server-client communication of past systems.

Referring again to FIG. 2, an "E-series" solar panel is the currently selected solar panel type 230. However, a different solar panel type 230 can be an option for selection at the job site. The solar panel types 230 can denote different types of solar cells (e.g., crystalline silicon, thin film, front contact, back contact, etc.), solar cell and/or solar module efficiencies, solar cell and/or solar module dimensions, variations in module interconnections (e.g., ribbon configurations, busbar configurations, shingled cells, etc.), module-level electronics (e.g. DC-DC optimizers, module-level inverters) and/or variations in packaging (e.g., laminate materials, module frames, module backsheet, module glass, bifacial module components, solar concentrating components, solar thermal components), and the like. Specific solar panel types may include, for example, any one of the models manufactured by Sunpower Corporation. Therefore, the server 125 may have previously calculated an energy production estimate for a solar panel for 5 different arrays and 4 solar panel types 230, and transmitted 20 energy production estimates to the mobile device 110 as part of the pre-calculation phase, for example.

One or more sections of a roof at an installation location can include one or more solar panels 205, 210. Each section of the roof that includes at least one solar panel 205, 210 can correspond to one array of solar panels 215. Each array of solar panels 215 can be selected/deselected which can correspond to selecting/deselecting each solar panel 205, 210 in that array simultaneously. For example, the array number indicator 220 can be selected. When highlighted (i.e., selected), an array of solar panels 215 (rather than individual solar panels) can be selected/deselected, and the selection/deselection can update the number of arrays in the array number indicator 220. More specifically, the array of solar panels 215 has 18 selected solar panels 205 and 2 deselected solar panels 210. If the array number indicator 220 is highlighted, which can correspond to array selection/deselection rather than individual solar panels, the array of solar panels 215 can be deselected and the array number indicator 220 would update to 2 arrays. Similarly, if another one or more arrays are selected, the array number indicator 220 can increase corresponding to the number of arrays selected.

The mobile device 110 can locally store the energy production estimates for each solar panel received from the server 125. The selection and/or deselection of a solar panel 205, 210 can correspond to the energy production 235. For example, selecting a solar panel can increase the energy production 235 and deselecting a solar panel can decrease the energy production 235. The energy production 235 can have units of kilowatt hours per year, for example. Additionally, if an array of solar panels 215 is selected, the energy production for the entire array can be calculated and added to the energy production 235. The energy production for an array can be calculated based on the energy production estimate determined for a single solar panel in that array multiplied by the number of solar panels in that array. The energy production for that array can then be added to the total energy production 235.

The calculation to determine the total energy production 235 can be based on an average solar panel energy output which has been previously determined via the server 125. The mobile device 110 has already locally stored the energy production estimates for each type of solar panel for each array. Therefore, selecting a solar panel in a specific array has a predetermined energy production value that can be added to the total energy production 235. Additionally, when an array of solar panels is selected (e.g., the array of solar panels 215), the average solar panel energy production for a solar panel in that array is multiplied by the number of solar panels in that array. For example, if the average solar panel energy production was 100 kWh/year for a specific array and there are 10 solar panels in that array, then 1000 kWh/year can be added to the total energy production 235. To calculate the total energy production 235, the energy production value of each array can be summed. For example, referring to FIG. 2, there are 5 different arrays and only 3 arrays have at least one solar panel selected. The value of the average energy production for a solar panel in each array can be multiplied by the number of activated solar panels (e.g., selected solar panels 205) in that array, and then the energy production value of each array can be summed to get the total energy production 235. For example, referring to Equation 1:

$$S_1A_1 + S_2A_2 + \ldots + S_nA_n = E_{Total}$$

where S is equal to the number of selected solar panels in an array, A is equal to the average solar panel energy production for that array, and $E_{Total}$ is equal to the total energy production 235 of all the selected solar panels.

Therefore, dynamic selection and/or deselection of a solar panel and/or an array of solar panels and the corresponding energy production 235 for each selection and/or deselection can be displayed in real time. Additionally, the dynamic selection and/or deselection of any individual solar panel and/or array can update the energy offset 245 in real time. The energy offset 245 can be based on comparing the energy production 235 and the energy needs 240 of the installation location. The energy needs 240 of the installation location can be determined based on a homeowner's historical utility bills collected from the homeowner by the sales representative, for example.

Figure 3:
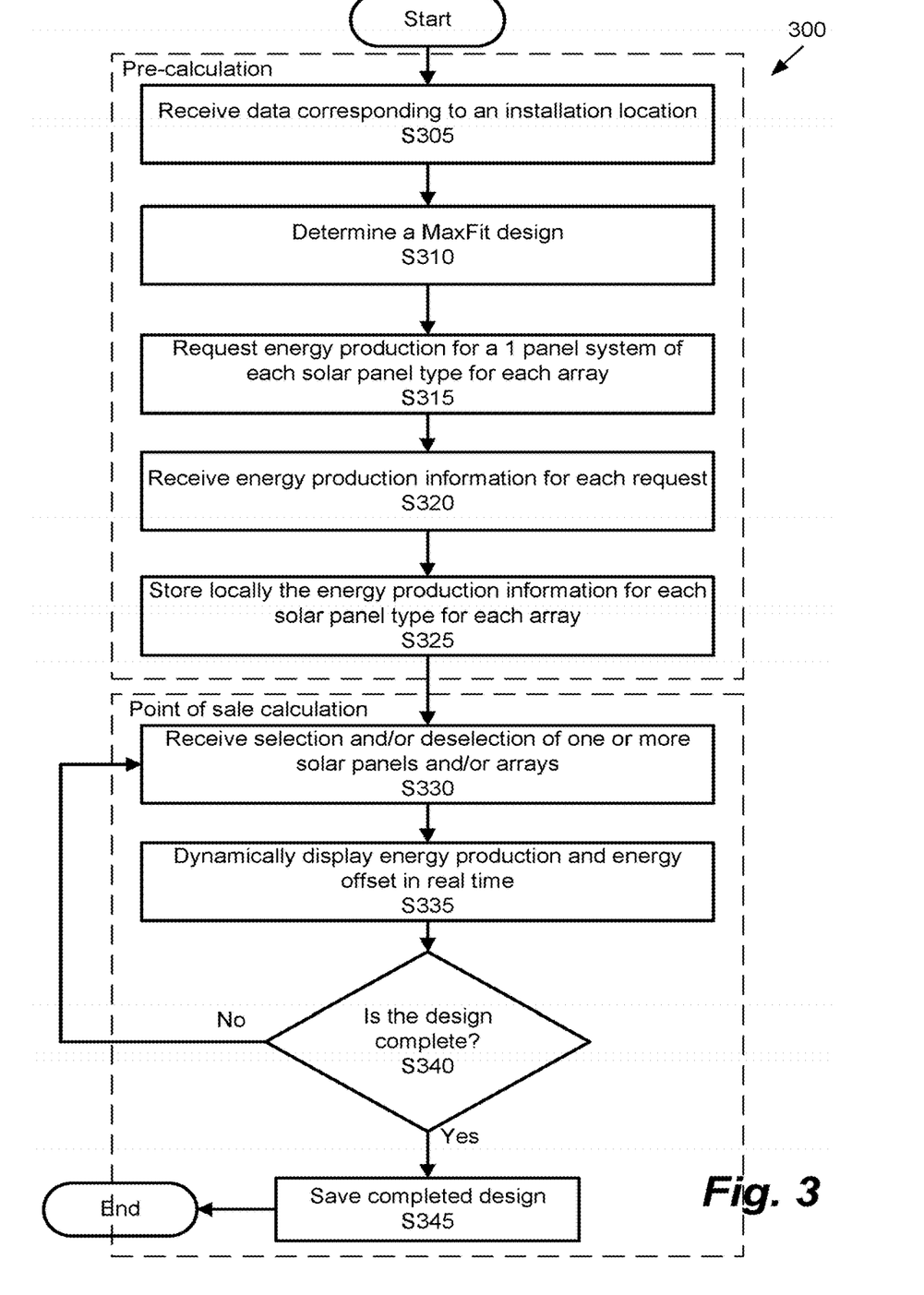
FIG. 3 is an algorithmic flow chart of a solar panel placement optimization process according to one or more aspects of the exemplary disclosures.

FIG. 3 is an algorithmic flow chart of a solar panel placement optimization process 300 according to one or more aspects of the exemplary disclosures.

In S305, data corresponding to an installation location can be received as installation location information. The installation location data can correspond to the data necessary to determine the MaxFit design. The data corresponding to the installation location can include weather, latitude/longitude, tilt, azimuth, shading, insolation, soiling, local fire codes, and the like that are unique to the installation location.

In S310, the MaxFit design can be determined. The MaxFit design can be based on the number of solar panels that can be placed on one or more sections of the roof of the installation location, wherein each section of the roof can correspond to an array of solar panels. The number of solar panels on each section of the roof may be constrained by a size of the section of the roof, or may be constrained by other factors includes fire codes, for example.

In S315, the energy production for a 1 panel system of each available panel type for each array can be determined. More specifically, solar panels on different sections of the roof (i.e., solar panels belonging to different arrays) may have different energy production values (e.g., based on which cardinal direction each section of the roof is facing). Therefore, an energy production estimate is calculated for 1 solar panel in each array (i.e., each separate section of the roof). Additionally, an energy production estimate is calculated for each solar panel type because each solar panel type may correspond to a different energy production value even if placed in the same location. The energy production estimate for a solar panel can be calculated by the server using industry-standard and/or proprietary energy modeling tools that output annual, monthly, or hourly kilowatt-hour values.

In S320, energy production information for each request can be received from the server 125, for example. The number of requests can be based on the number of arrays and the number of types of solar panels. For example, with reference to FIG. 2, the server 125 may transmit 20 responses to the mobile device 110.

In S325, the energy production information for each panel type for each array can be stored locally in the mobile device 110, for example. With the energy production information stored locally, optimization of solar panel placement can occur in real time. It should be appreciated that S305 through S325 can occur as a pre-calculation prior to a salesperson going on a sales call, wherein the pre-calculation can determine the energy production information for each solar panel type for each array. More specifically, after S325 the mobile device 110 does not need to communicate with the server 125 to perform the additional calculations based on any selection and/or deselection of any solar panels and/or arrays.

In S330, selection and/or deselection of one or more solar panels and/or arrays can be received via input on the mobile device 110, for example, at a job site (i.e., an installer interacting with a customer). For example, selection of a solar panel and/or array can correspond to highlighting the solar panel and/or array to indicate that the solar panel and/or the array has been selected. Similarly, any deselection of a solar panel and/or an array can correspond to removing the highlight.

In S335, energy production (e.g., energy production 235) and energy offset (e.g., energy offset 245) can be dynamically displayed in real time. The energy production and energy offset can be updated in real time based on the selection and/or deselection of any solar panels and/or arrays (e.g., solar panels 205, 210 and the array of solar panels 215).

In S340, it can be determined if a design is complete. The design can be a point of sale design which can correspond to a customer's preferred solar panels and/or solar arrays selected within the MaxFit design (e.g., the highlighted solar panels in FIG. 2 could be the design). If it is determined that the design is not complete, then the process can return to S330 to receive selection and/or deselection of one or more solar panels and/or arrays. However, if it is determined that the design is complete (e.g., via selecting an option via the user interface to finalize the design), then the process can continue to save the completed design in S345.

In S345, the completed design can be saved and stored locally and/or at the database 120, for example. Once the design has been saved, the process can end.

It should be appreciated that S330 through S345 can correspond to a point of sale calculation and occur at a point of sale such that the mobile device 110 performs any calculation independently of the server 125 at the point of sale. In other words, the point of sale calculation determines a customer's preferred solar panel and/or solar array placement by dynamically updating and displaying the design and corresponding energy production and energy offset. Although the mobile device 110 does not make additional request to the server 125 during the point of sale calculation, there can be some initial communication with the server 125 (e.g., for authentication). Additionally, when a design is finalized locally at the mobile device 110, the final design can be uploaded to the server 125. In other words, even when the mobile device 110 is operating locally to dynamically update and display the design, energy production, and energy offset without contacting the server 125, the mobile device 110 can still be in communication with the server 125 for specific tasks other than the point of sale calculation.

It should be appreciated that the mobile device 110 can include two applications where a first application runs the pre-calculation and a second application runs the point of sale calculation. In other words, the mobile device 110 can use the first application to determine the energy production information for each solar panel type for each array by communicating with the server 125. After that information is stored locally, the second application can be used for the point of sale calculation by accessing the locally stored information without making additional requests to the server 125. In one embodiment, both the pre-calculation and the point of sale calculation can be handled by a single application or can also be handled by separate modules of a same platform. Thus, the architecture of the application(s) or platform uses to implement the inventive concepts described herein are not limiting upon the present disclosure.

Figure 4:
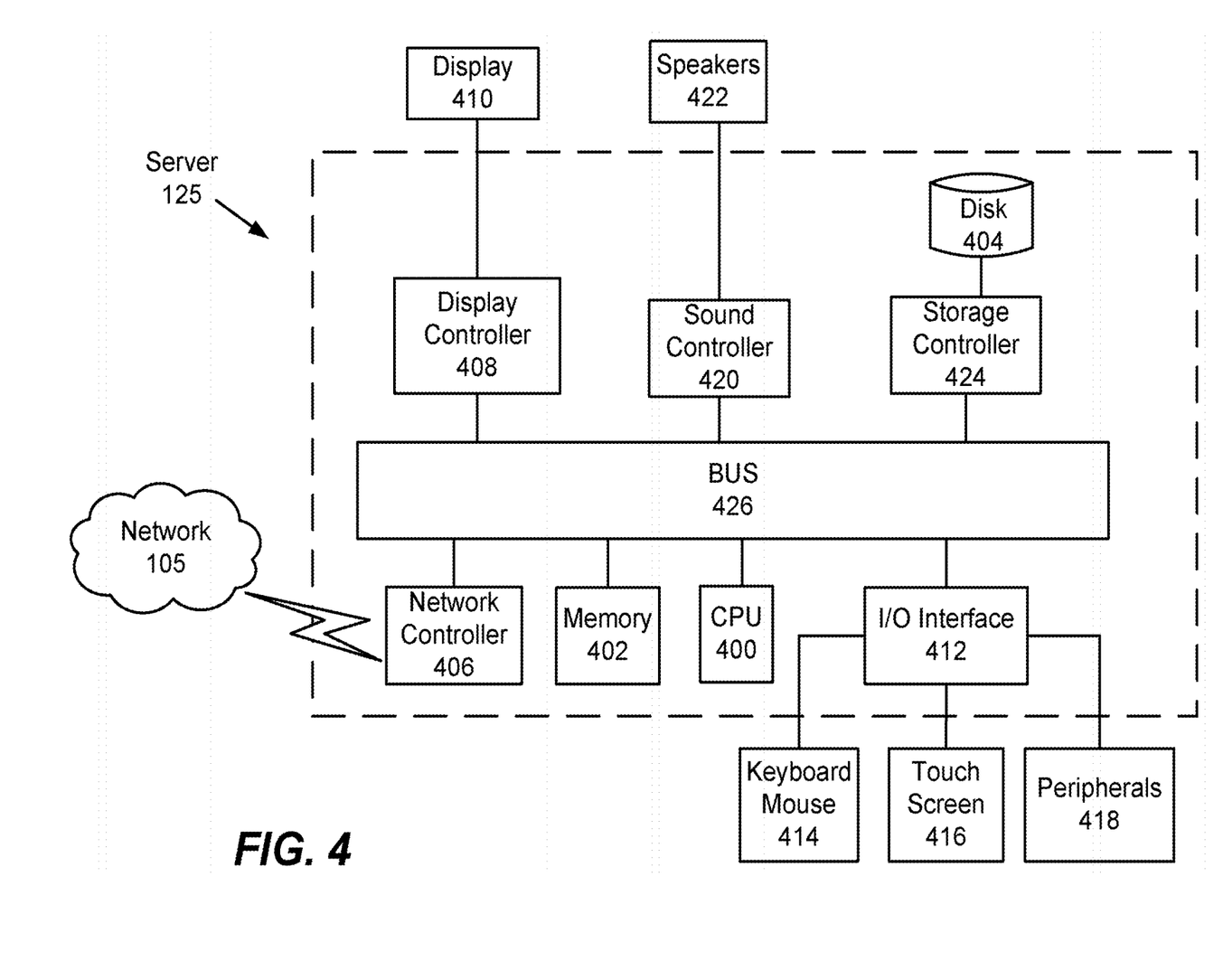
FIG. 4 is a hardware block diagram of a server according to one or more exemplary aspects of the exemplary disclosures.

FIG. 4 is a hardware block diagram of a server, according to certain exemplary aspects. In FIG. 4, the server 125 includes a CPU 400 which performs the processes described above/below. The process data and instructions may be stored in memory 402. These processes and instructions may also be stored on a storage medium disk 404 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the server 125 communicates, such as a computer or another server.

Further, the claimed advancements may be provided as a utility application, background daemon, or component of an operating system, or combination thereof, executing in conjunction with CPU 400 and an operating system such as Microsoft Windows 7, UNIX, Solaris, LINUX, Apple MAC-OS and other systems known to those skilled in the art.

The hardware elements in order to achieve the server 125 may be realized by various circuitry elements, known to those skilled in the art. For example, CPU 400 may be a Xenon or Core processor from Intel of America or an Opteron processor from AMD of America, or may be other processor types that would be recognized by one of ordinary skill in the art. Alternatively, the CPU 400 may be implemented on an FPGA, ASIC, PLD or using discrete logic circuits, as one of ordinary skill in the art would recognize. Further, CPU 400 may be implemented as multiple processors cooperatively working in parallel to perform the instructions of the inventive processes described above.

The server 125 in FIG. 4 also includes a network controller 406, such as an Intel Ethernet PRO network interface card from Intel Corporation of America, for interfacing with network 105. As can be appreciated, the network 105 can be a public network, such as the Internet, or a private network such as an LAN or WAN network, or any combination thereof and can also include PSTN or ISDN sub-networks. The network 105 can also be wired, such as an Ethernet network, or can be wireless such as a cellular network including EDGE, 3G and 4G wireless cellular systems. The wireless network can also be Wi-Fi, BLUETOOTH, or any other wireless form of communication that is known.

The server 125 further includes a display controller 408, such as a NVIDIA GeForce GTX or Quadro graphics adaptor from NVIDIA Corporation of America for interfacing with display 410, such as a Hewlett Packard HPL2445w LCD monitor. A general purpose I/O interface 412 interfaces with a keyboard and/or mouse 414 as well as a touch screen panel 416 on or separate from display 410. General purpose I/O interface also connects to a variety of peripherals 418 including printers and scanners, such as an OfficeJet or DeskJet from Hewlett Packard.

A sound controller 420 is also provided in the server 125, such as Sound Blaster X-Fi Titanium from Creative, to interface with speakers/microphone 422 thereby providing sounds and/or music.

The general purpose storage controller 424 connects the storage medium disk 404 with communication bus 426, which may be an ISA, EISA, VESA, PCI, or similar, for interconnecting all of the components of the server 125. A description of the general features and functionality of the display 410, keyboard and/or mouse 414, as well as the display controller 408, storage controller 424, network controller 406, sound controller 420, and general purpose I/O interface 412 is omitted herein for brevity as these features are known.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Figure 5:
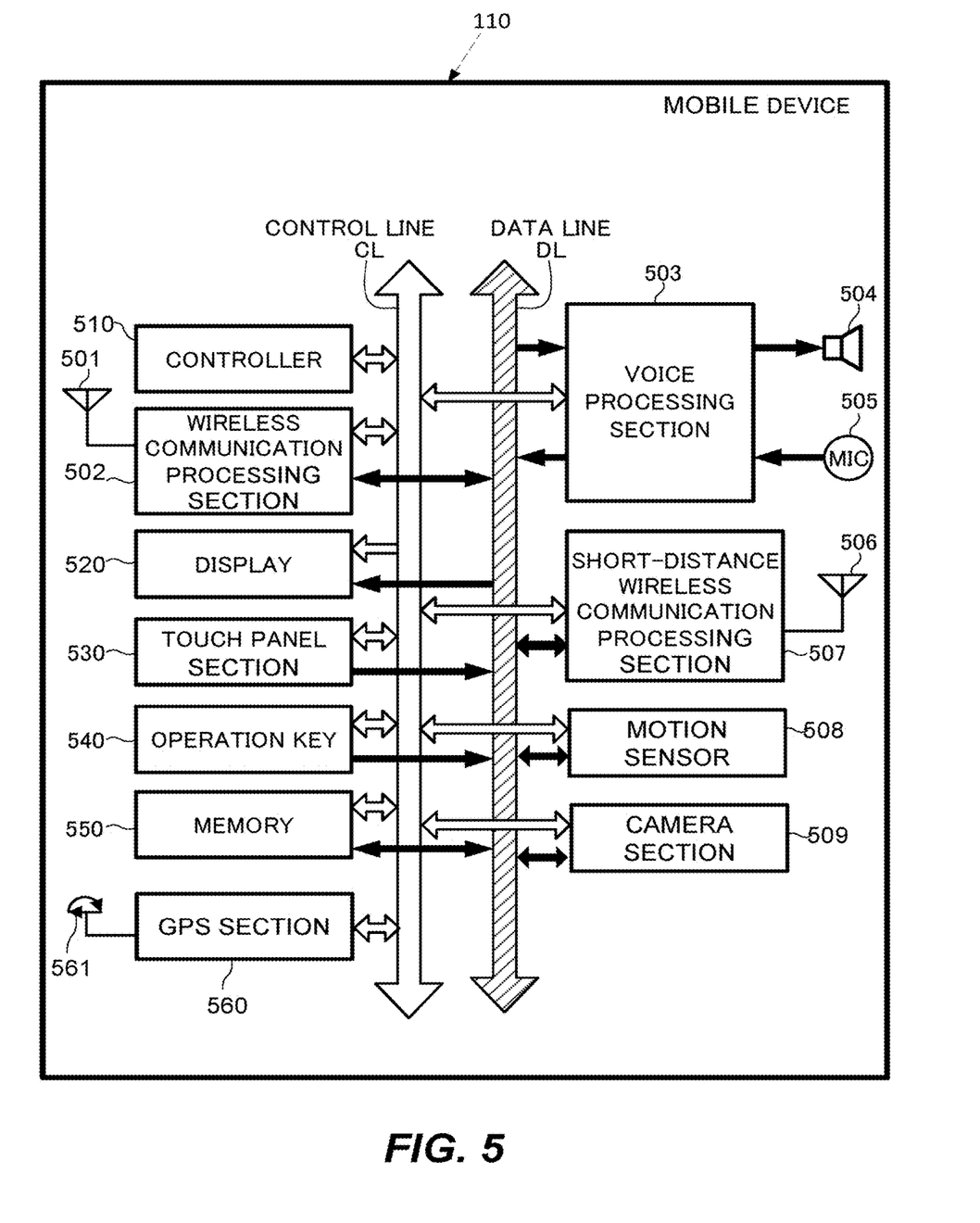
FIG. 5 is a hardware block diagram of a mobile device according to one or more aspects of the exemplary disclosures.

FIG. 5 is a more detailed block diagram illustrating an exemplary mobile device 110 according to certain embodiments of the present disclosure. In certain embodiments, mobile device 110 may be a smartphone. However, the skilled artisan will appreciate that the features described herein may be adapted to be implemented on other devices (e.g., a laptop, a tablet, a server, an e-reader, a camera, a navigation device, etc.). The exemplary mobile device 110 of FIG. 5 includes a controller 510 and a wireless communication processor 502 connected to an antenna 501. A speaker 504 and a microphone 505 are connected to a voice processor 503.

The controller 510 is an example of a control unit and may include one or more Central Processing Units (CPUs), and may control each element in the mobile device 110 to perform functions related to communication control, audio signal processing, control for the audio signal processing, still and moving image processing and control, and other kinds of signal processing. The controller 510 may perform these functions by executing instructions stored in a memory 550. Alternatively or in addition to the local storage of the memory 550, the functions may be executed using instructions stored on an external device accessed on a network or on a non-transitory computer readable medium.

The memory 550 can includes Read Only Memory (ROM), Random Access Memory (RAM), or a memory array including a combination of volatile and non-volatile memory units. The memory 550 may be utilized as working memory by the controller 510 while executing the processes and algorithms of the present disclosure. Additionally, the memory 550 may be used for long-term storage, e.g., of image data and information related thereto.

The mobile device 110 includes a control line CL and data line DL as internal communication bus lines. Control data to/from the controller 510 may be transmitted through the control line CL. The data line DL may be used for transmission of voice data, display data, etc.

The antenna 501 transmits/receives electromagnetic wave signals between base stations for performing radio-based communication, such as the various forms of cellular telephone communication. The wireless communication processor 502 controls the communication performed between the mobile device 110 and other external devices via the antenna 501. For example, the wireless communication processor 502 may control communication between base stations for cellular phone communication.

The speaker 504 emits an audio signal corresponding to audio data supplied from the voice processor 503. The microphone 505 detects surrounding audio and converts the detected audio into an audio signal. The audio signal may then be output to the voice processor 503 for further processing. The voice processor 503 demodulates and/or decodes the audio data read from the memory 550 or audio data received by the wireless communication processor 502 and/or a short-distance wireless communication processor 507. Additionally, the voice processor 503 may decode audio signals obtained by the microphone 505.

The exemplary mobile device 110 may also include a display 520, a touch panel 530, an operation key 540, and a short-distance communication processor 507 connected to an antenna 506. The display 520 may be a Liquid Crystal Display (LCD), an organic electroluminescence display panel, or another display screen technology. In addition to displaying still and moving image data, the display 520 may display operational inputs, such as numbers or icons which may be used for control of the mobile device 110. The display 520 may additionally display a GUI for a user to control aspects of the mobile device 110 and/or other devices. Further, the display 520 may display characters and images received by the mobile device 110 and/or stored in the memory 550 or accessed from an external device on a network. For example, the mobile device 110 may access a network such as the Internet and display text and/or images transmitted from a Web server.

The touch panel 530 may include a physical touch panel display screen and a touch panel driver. The touch panel 530 may include one or more touch sensors for detecting an input operation on an operation surface of the touch panel display screen. The touch panel 530 also detects a touch shape and a touch area. Used herein, the phrase "touch operation" refers to an input operation performed by touching an operation surface of the touch panel display with an instruction object, such as a finger, thumb, or stylus-type instrument. In the case where a stylus or the like is used in a touch operation, the stylus may include a conductive material at least at the tip of the stylus such that the sensors included in the touch panel 530 may detect when the stylus approaches/contacts the operation surface of the touch panel display (similar to the case in which a finger is used for the touch operation).

In certain aspects of the present disclosure, the touch panel 530 may be disposed adjacent to the display 520 (e.g., laminated) or may be formed integrally with the display 520. For simplicity, the present disclosure assumes the touch panel 530 is formed integrally with the display 520 and therefore, examples discussed herein may describe touch operations being performed on the surface of the display 520 rather than the touch panel 530. However, the skilled artisan will appreciate that this is not limiting.

For simplicity, the present disclosure assumes the touch panel 530 is a capacitance-type touch panel technology. However, it should be appreciated that aspects of the present disclosure may easily be applied to other touch panel types (e.g., resistance-type touch panels) with alternate structures. In certain aspects of the present disclosure, the touch panel 530 may include transparent electrode touch sensors arranged in the X-Y direction on the surface of transparent sensor glass.

The touch panel driver may be included in the touch panel 530 for control processing related to the touch panel 530, such as scanning control. For example, the touch panel driver may scan each sensor in an electrostatic capacitance transparent electrode pattern in the X-direction and Y-direction and detect the electrostatic capacitance value of each sensor to determine when a touch operation is performed. The touch panel driver may output a coordinate and corresponding electrostatic capacitance value for each sensor. The touch panel driver may also output a sensor identifier that may be mapped to a coordinate on the touch panel display screen. Additionally, the touch panel driver and touch panel sensors may detect when an instruction object, such as a finger is within a predetermined distance from an operation surface of the touch panel display screen. That is, the instruction object does not necessarily need to directly contact the operation surface of the touch panel display screen for touch sensors to detect the instruction object and perform processing described herein. For example, in certain embodiments, the touch panel 530 may detect a position of a user's finger around an edge of the display panel 520 (e.g., gripping a protective case that surrounds the display/touch panel). Signals may be transmitted by the touch panel driver, e.g. in response to a detection of a touch operation, in response to a query from another element based on timed data exchange, etc.

The touch panel 530 and the display 520 may be surrounded by a protective casing, which may also enclose the other elements included in the mobile device 110. In certain embodiments, a position of the user's fingers on the protective casing (but not directly on the surface of the display 520) may be detected by the touch panel 530 sensors. Accordingly, the controller 510 may perform display control processing described herein based on the detected position of the user's fingers gripping the casing. For example, an element in an interface may be moved to a new location within the interface (e.g., closer to one or more of the fingers) based on the detected finger position.

Further, in certain embodiments, the controller 510 may be configured to detect which hand is holding the mobile device 110, based on the detected finger position. For example, the touch panel 530 sensors may detect a plurality of fingers on the left side of the mobile device 110 (e.g., on an edge of the display 520 or on the protective casing), and detect a single finger on the right side of the mobile device 110. In this exemplary scenario, the controller 510 may determine that the user is holding the mobile device 110 with his/her right hand because the detected grip pattern corresponds to an expected pattern when the mobile device 110 is held only with the right hand.

The operation key 540 may include one or more buttons or similar external control elements, which may generate an operation signal based on a detected input by the user. In addition to outputs from the touch panel 530, these operation signals may be supplied to the controller 510 for performing related processing and control. In certain aspects of the present disclosure, the processing and/or functions associated with external buttons and the like may be performed by the controller 510 in response to an input operation on the touch panel 530 display screen rather than the external button, key, etc. In this way, external buttons on the mobile device 110 may be eliminated in lieu of performing inputs via touch operations, thereby improving water-tightness.

The antenna 506 may transmit/receive electromagnetic wave signals to/from other external apparatuses, and the short-distance wireless communication processor 507 may control the wireless communication performed between the other external apparatuses. Bluetooth, IEEE 802.11, and near-field communication (NFC) are non-limiting examples of wireless communication protocols that may be used for inter-device communication via the short-distance wireless communication processor 507.

The mobile device 110 may include a motion sensor 508. The motion sensor 508 may detect features of motion (i.e., one or more movements) of the mobile device 110. For example, the motion sensor 508 may include an accelerometer to detect acceleration, a gyroscope to detect angular velocity, a geomagnetic sensor to detect direction, a geo-location sensor to detect location, etc., or a combination thereof to detect motion of the mobile device 110. In certain embodiments, the motion sensor 508 may generate a detection signal that includes data representing the detected motion. For example, the motion sensor 508 may determine a number of distinct movements in a motion (e.g., from start of the series of movements to the stop, within a predetermined time interval, etc.), a number of physical shocks on the mobile device 110 (e.g., a jarring, hitting, etc., of the electronic device), a speed and/or acceleration of the motion (instantaneous and/or temporal), or other motion features. The detected motion features may be included in the generated detection signal. The detection signal may be transmitted, e.g., to the controller 510, whereby further processing may be performed based on data included in the detection signal. The motion sensor 508 can work in conjunction with a Global Positioning System (GPS) section 560. The GPS section 560 detects the present position of the mobile device 110. The information of the present position detected by the GPS section 560 is transmitted to the controller 510. An antenna 561 is connected to the GPS section 560 for receiving and transmitting signals to and from a GPS satellite.

The mobile device 110 may include a camera section 509, which includes a lens and shutter for capturing photographs of the surroundings around the mobile device 110. In an embodiment, the camera section 509 captures surroundings of an opposite side of the mobile device 110 from the user. The images of the captured photographs can be displayed on the display panel 520. A memory section saves the captured photographs. The memory section may reside within the camera section 509 or it may be part of the memory 550. The camera section 509 can be a separate feature attached to the mobile device 110 or it can be a built-in camera feature.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. A system for determining solar panel placement and corresponding energy output, comprising:
   a computing device; and
   a server configured to be coupled to the computing device via a network and including circuitry configured to:
      receive a request from the computing device for energy production information for one or more solar panels and one or more arrays of solar panels, wherein the request includes installation location information corresponding to an installation location, and
      transmit the energy production information for the one or more solar panels and the one or more arrays of solar panels to the computing device,
   wherein the computing device includes circuitry configured to:
      store a predetermined solar panel layout for the installation location, the predetermined solar panel layout including a plurality of solar panels, the predetermined solar panel layout being fixed,
      store the energy production information, and
      without making additional requests to the server:
         receive a selection and deselection of one or more solar panels less than all of the plurality of solar panels in the predetermined solar panel layout, and
         determine a design for the installation location based on the selection and deselection of the one or more solar panels less than all of the plurality of solar panels in the predetermined solar panel layout and an energy production estimate based on the stored energy production information.

2. The system of claim 1, wherein the circuitry of the computing device is further configured to:
   receive the installation location information,
   request energy production for a panel system of one or more solar panel types for each solar panel array,
   receive the energy production information for each request, wherein a number of requests is based on a number of solar panel arrays and a number of types of solar panels, and
   locally store the energy production information for each solar panel type and for each solar panel array.

3. The system of claim 2, wherein the installation location information includes weather, latitude/longitude, tilt, azimuth, shading, insolation, soiling, and local fire codes.

4. The system of claim 2, wherein the circuitry of the computing device is further configured to:
   dynamically display energy production and energy offset in real time based on one or more of the selection and deselection of the one or more solar panels less than all of the plurality of solar panels in the predetermined solar panel layout,
   determine if the design for the installation location is complete, and
   store the completed design for the installation location when the design for the installation location is complete.

5. The system of claim 4, wherein the design is a subset of one or more solar panels and one or more solar panel arrays within the predetermined solar panel layout.

6. The system of claim 4, wherein the energy production for each solar panel array is calculated based on an average solar panel energy production for one solar panel belonging to that solar panel array multiplied by a number of selected solar panels in that solar panel array.

7. The system of claim 6, wherein total energy production is based on a sum of energy production for each solar panel array:

$$S1A1 + S2A2 + \ldots + SnAn = E\text{Total}$$

where S is equal to the number of selected solar panels in an array, A is equal to the average solar panel energy production for that array, and ETotal is equal to the total energy production of all the selected solar panels.

8. A method for determining solar panel placement and corresponding energy output, comprising:

receiving, at a server, a request from a computing device for energy production information for one or more solar panels and one or more arrays of solar panels, wherein the request includes installation location information corresponding to an installation location;

transmitting, from the server, the energy production information for the one or more solar panels and the one or more arrays of solar panels to the computing device;

storing, at the computing device, a predetermined solar panel layout for the installation location, the predetermined solar panel layout including a plurality of solar panels, the predetermined solar panel layout being fixed;

storing, at the computing device, the energy production information for the one or more solar panels and the one or more arrays of solar panels;

receiving, at the computing device without additional requests to the server, a selection and deselection of one or more solar panels less than all of the plurality of solar panels in the predetermined solar panel layout; and determining, at the computing device without additional requests to the server, a design for the installation location based on the selection or deselection of the one or more solar panels less than all of the plurality of solar panels and an energy production estimate.

9. The method of claim 8, further comprising:

receiving the installation location information at the computing device;

requesting, by the computing device, energy production for a panel system of one or more solar panel types for each solar panel array;

receiving, at the computing device, the energy production information for each request, wherein a number of requests is based on a number of solar panel arrays and a number of types of solar panels; and locally storing, at the computing device, the energy production information for each solar panel type for each solar panel array.

10. The method of claim 9, wherein the installation location information includes weather, latitude/longitude, tilt, azimuth, shading, insolation, soiling, and local fire codes.

11. The method of claim 8, further comprising:

dynamically displaying, on a display of the computing device, energy production and energy offset in real time based on one or more of the selection and deselection of the one or more solar panels less than all of the plurality of solar panels in the predetermined solar panel layout;

determining, at the computing device, if the design for the installation location is complete; and storing, at the computing device, the design for the installation location when the design for the installation location is complete.

12. The method of claim 9, wherein the design is a subset of one or more solar panels and one or more solar panel arrays within the predetermined solar panel layout.

13. The method of claim 9, wherein the energy production for each solar panel array is calculated based on an average solar panel energy production for one solar panel belonging to that solar panel array multiplied by a number of selected solar panels in that solar panel array.

14. The method of claim 13, wherein total energy production is based on a sum of the energy production for each solar panel array $$S1A1+S2A2+ \ldots +SnAn=E\text{Total}$$

where S is equal to the number of selected solar panels in an array, A is equal to the average solar panel energy production for that array, and ETotal is equal to the total energy production of all the selected solar panels.

15. A non-transitory computer-readable storage medium that stores instructions that, when executed by a computer, causes the computer to perform a method comprising:

receiving, at a server, a request from a computing device for energy production information for one or more solar panels and one or more arrays of solar panels, wherein the request includes installation location information corresponding to an installation location;

transmitting, from the server, the energy production information for the one or more solar panels and the one or more arrays of solar panels;

storing, at the computing device, a predetermined solar panel layout for the installation location, the predetermined solar panel layout including a plurality of solar panels, the predetermined solar panel layout being fixed;

storing, at the computing device, the energy production information for the one or more solar panels and the one or more arrays of solar panels;

receiving, at the computing device without additional requests to the server, a selection and deselection of one or more solar panels less than all of the plurality of solar panels in the predetermined solar panel layout; and determining, at the computing device without additional requests to the server, a design for the installation location based on the selection or deselection of the one or more solar panels less than all of the plurality of solar panels and an energy production estimate.

16. The non-transitory computer-readable storage medium of claim 15, wherein determining the energy production information for the one or more solar panels and for the one or more arrays of solar panels includes receiving the installation location information;

requesting energy production for a one panel system of one or more solar panel types for each solar panel array;

receiving the energy production information for each request, wherein a number of requests is based on a number of solar panel arrays and a number of types of solar panels; and locally storing, at the computing device, the energy production information for each solar panel type for each solar panel array.

17. The non-transitory computer-readable storage medium of claim 16, wherein the installation location information includes weather, latitude/longitude, tilt, azimuth, shading, insolation, soiling, and local fire codes.

18. The non-transitory computer-readable storage medium of claim 16, wherein determining the design for the installation location includes:

dynamically displaying energy production and energy offset in real time based on one or more of the selection and deselection of the one or more solar panels less than all of the plurality of solar panels in the predetermined solar panel layout;

determining if the design for the installation location is complete, wherein the design for the installation location is a preferred selection of one or more solar panels and one or more solar panel arrays within the predetermined solar panel layout; and storing the design for the installation location when the design for the installation location is complete.

19. The non-transitory computer-readable storage medium of claim 18, wherein the energy production for each solar panel array is calculated based on an average solar panel energy production for one solar panel belonging to that solar panel array multiplied by a number of selected solar panels in that solar panel array.

20. The non-transitory computer-readable storage medium of claim 19, wherein total energy production is based on a sum of the energy production for each solar panel array $$S1A1+S2A2+\ldots+SnAn=E\text{Total}$$

where S is equal to the number of selected solar panels in an array, A is equal to the average solar panel energy production for that array, and ETotal is equal to the total energy production of all the selected solar panels.

* * * * *